(12) United States Patent
Park

(10) Patent No.: US 8,791,443 B2
(45) Date of Patent: Jul. 29, 2014

(54) HIGH DENSITY VARIABLE RESISTIVE MEMORY AND METHOD OF FABRICATING THE SAME

(75) Inventor: Nam Kyun Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/601,490

(22) Filed: Aug. 31, 2012

(65) Prior Publication Data
US 2013/0313502 A1    Nov. 28, 2013

(30) Foreign Application Priority Data

May 24, 2012   (KR) .................. 10-2012-0055456

(51) Int. Cl.
*H01L 21/20* (2006.01)

(52) U.S. Cl.
USPC ............... 257/2; 438/102; 438/197; 438/237; 438/382; 438/482

(58) Field of Classification Search
USPC ............. 257/2, 4, 295, 314, E45.002, E21.09
See application file for complete search history.

(56) References Cited

U.S. PATENT DOCUMENTS

| 2011/0037046 A1* | 2/2011 | Sato et al. ............. 257/4 |
| 2012/0286227 A1* | 11/2012 | Chung ............. 257/4 |
| 2013/0016555 A1* | 1/2013 | Kim et al. ............. 365/163 |

FOREIGN PATENT DOCUMENTS

| KR | 1020050070800 | 7/2005 |
| KR | 1020100111798 | 10/2010 |

* cited by examiner

*Primary Examiner* — Chuong A Luu
*Assistant Examiner* — Rodolfo Fortich
(74) *Attorney, Agent, or Firm* — IP & T Group LLP

(57) ABSTRACT

A high density variable resistive random access memory device and a method of fabricating the same are provided. The device includes first word lines, each separated from each other by a width of first word line; bit lines, each separated from each other by a width of bit line; and second word lines, each located between two adjacent first word lines, wherein the widths of first word line and the bit line are substantially same, and the bit lines are located over the first and second word lines.

9 Claims, 9 Drawing Sheets

HIGH DENSITY VARIABLE RESISTIVE MEMORY AND METHOD OF FABRICATING THE SAME

CROSS-REFERENCES TO RELATED APPLICATION

The present application claims priority under 35 U.S.C. 119(a) to Korean application number 10-2012-0055456, filed on May 24, 2012, in the Korean Patent Office, which is incorporated by reference in its entirety.

BACKGROUND OF THE INVENTION

1. Technical Field

The inventive concept relates to a high density variable resistive memory and a method of manufacturing the same, and more particularly, to a high density phase-change random access memory (PCRAM) device and a method of manufacturing the same.

2. Related Art

PCRAMs, a kind of variable resistive memory device, include a phase-change material of which a resistance is changed depending on a temperature. The phase-change material includes a chalcogenide material such as germanium (Ge), antimony (Sb), and tellurium (Te). The phase-change material is changed between an amorphous state and a crystalline state, depending on the temperature to define reset (or logic "1") and set (or logic "0").

In PCRAMs like dynamic random access memories (DRAMS), each memory cell defined by a word line and a bit line may include a variable resistor formed of a phase-change material and a switching element configured to selectively drive the variable resistor.

As shown in FIG. 1, memory cells are arranged at intersections of word lines WL1 and WL2 and bit lines BL1 and BL2. Each of the memory cells is designed to have a minimum $4F^2$ area by considering a word line pitch and a bit line pitch. The term 'F' means a critical dimension.

However, with demands on high integration, a PCRAM may be required to decrease the area of each cell.

SUMMARY

According to one aspect of an exemplary embodiment, there is a provided a high density variable resistive memory device. The device may include: first word lines, each separated from each other by a width of first word line; bit lines, each separated from each other by a width of bit line; and second word lines, each located between two adjacent first word lines, wherein the width of first word line is substantially identical to that of the bit line, and the bit lines are located over the first and second word lines.

According to another aspect of an exemplary embodiment, there is a provided a high density variable resistive memory device. The device may include: a semiconductor substrate in which line regions and space regions substantially having the same line widths are alternatively defined in a first direction and a second direction perpendicular to the first direction and junction regions are formed portions thereof corresponding to line regions of the first direction; first word lines formed on the semiconductor substrate and arranged in space regions of the first direction; second word lines formed on the semiconductor substrate and arranged in the line regions of the first direction; an interline insulating layer formed to surround sides and bottoms of the first word lines; a plurality of bit lines formed on the first and second word lines and arranged in line regions of the second direction to cross the first and second word lines; and a plurality of memory cells formed at intersections of the pluralities of first and second word lines and the plurality of bit lines.

According to another aspect of an exemplary embodiment, there is a provided a method of manufacturing a variable resistive memory device. The method may include: providing a semiconductor substrate in which line regions and space regions substantially having the same line widths are alternatively defined in a first direction and a second direction perpendicular to the first direction; forming a base insulating layer on the semiconductor substrate; sequentially stacking an interlayer insulating layer on the base insulating layer; etching the interlayer insulating layer corresponding to space regions of the first direction to define first word line regions; forming an interline insulating layer on bottoms and sidewalls of the first word lines; forming first word lines and switching elements connected to the first word lines in the first word line regions; selectively removing the remaining interlayer insulating layer to define second word line regions; forming second word lines and switching elements connected to the second word lines in the second word line regions; and forming variable resistive memory cells formed on the switching elements of the first and second word line regions.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
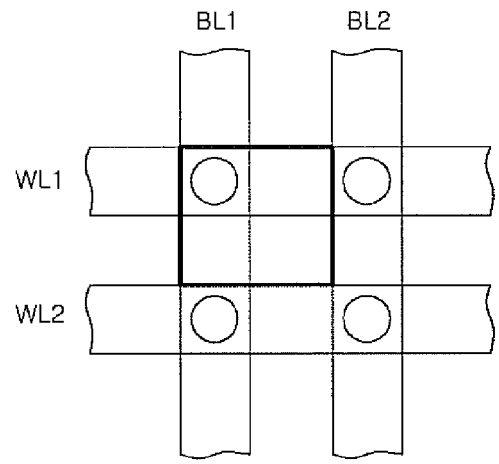
FIG. 1 is a schematic layout diagram illustrating a conventional PCRAM device.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 2:
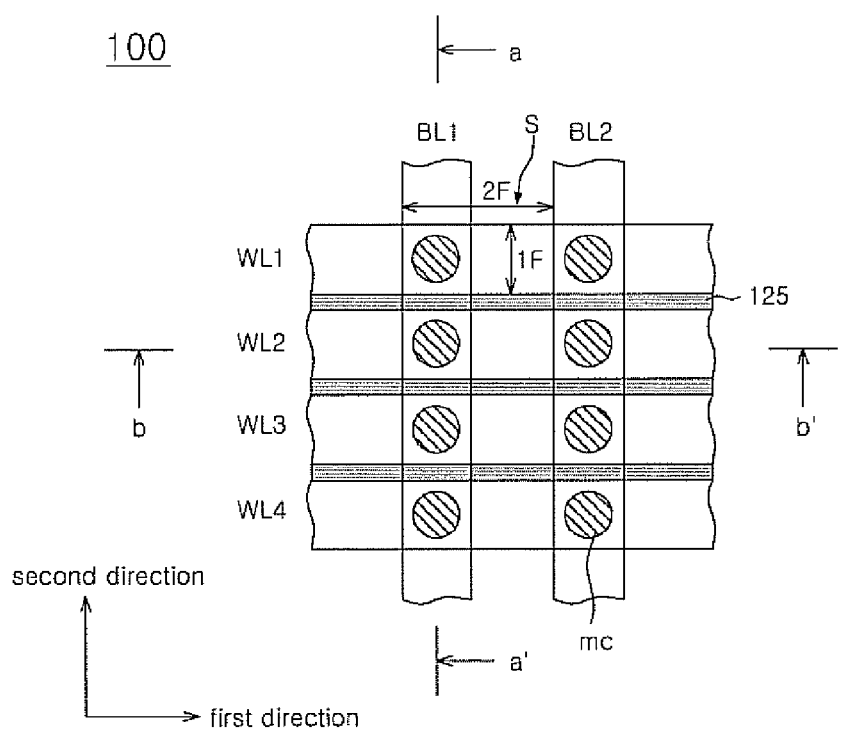
FIG. 2 is a schematic layout diagram schematically illustrating a PCRAM device according to an embodiment of the inventive concept.

Referring to FIG. 2, a semiconductor memory device 100 includes a semiconductor substrate (not shown) where line regions and space regions are alternatively defined in a first direction and a second direction. Here, the first direction may be a direction perpendicular to the second direction. Each of the line regions and space regions may have a line width of 1F.

The semiconductor memory device includes a plurality of word lines WL1 to WL4 and a plurality of bit lines BL1 and BL2 formed on the semiconductor substrate (not shown).

The word lines WL1 to WL4 may be consecutively arranged in the line region and the space regions of the first direction to be insulated from each other. An interline insulating layer 125 may be interposed between the word lines WL1 to WL4 to insulate adjacent word lines WL1 to WL4 from each other. The interline insulating layer 125 may be interposed between the word lines WL1 to WL4 to a minimum thickness so that the word lines WL1 to WL4 substantially have a line width of 1F. For example, the interline insulating layer 125 may have a thickness corresponding to $\frac{1}{10}$ to $\frac{1}{100}$ of the line width (1F) of the line regions and space regions.

A plurality of bit lines BL1 and BL2 may be arranged in line regions of the second direction to cross the plurality of word lines WL1 to WL4. Space regions of the second direction are present between the plurality of bit lines BL1 and BL2. That is, the bit lines BL1 and BL2 having a first line width (1F) may be spaced from each other by a space 'S' of the same line width as the first line width (1F).

Memory cells mc are located at intersections of the plurality of word lines WL1 to WL4 and the plurality of bit lines BL1 and BL2, respectively.

According to the embodiment, since the word lines are additionally arranged in the word line space regions, the number of word lines may be increased twice. Thus, an area of a unit memory cell mc may reduce up to about $2F^2$.

Figure 7:
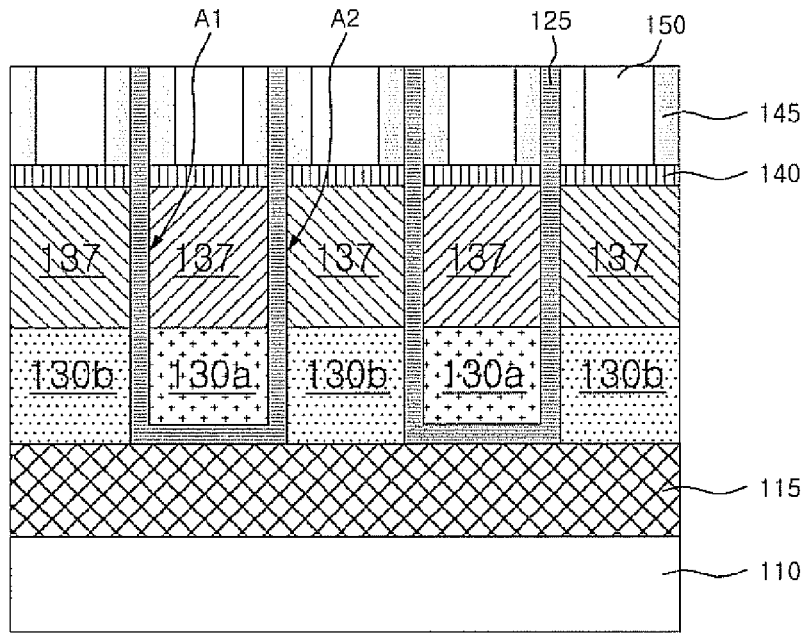
Figure 8:
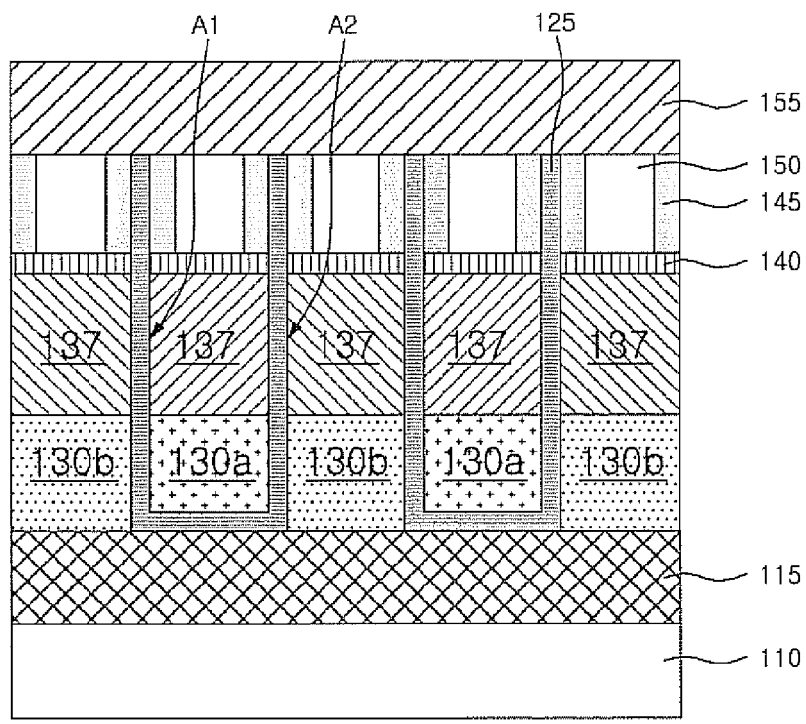
Figure 9:
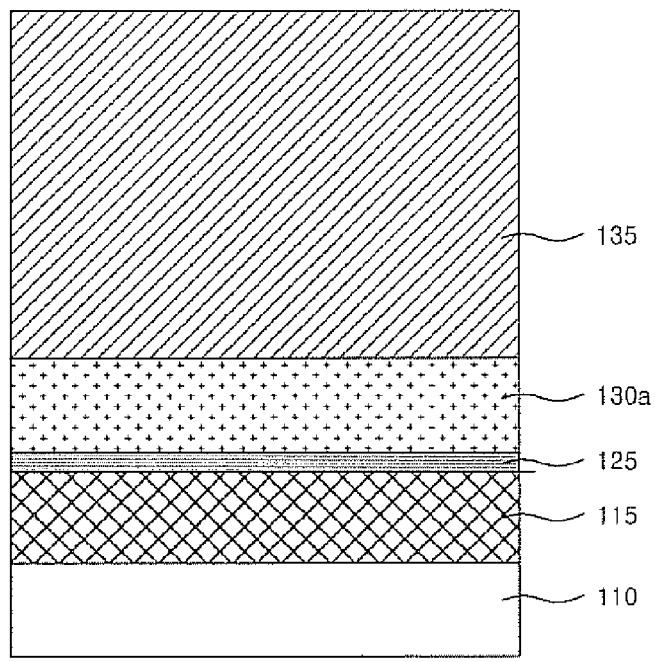
FIGS. 9 to 11 are cross-sectional views illustrating a method of fabricating a PCRAM device taken along a line of B-B' shown in FIG. 2.
Figure 10:
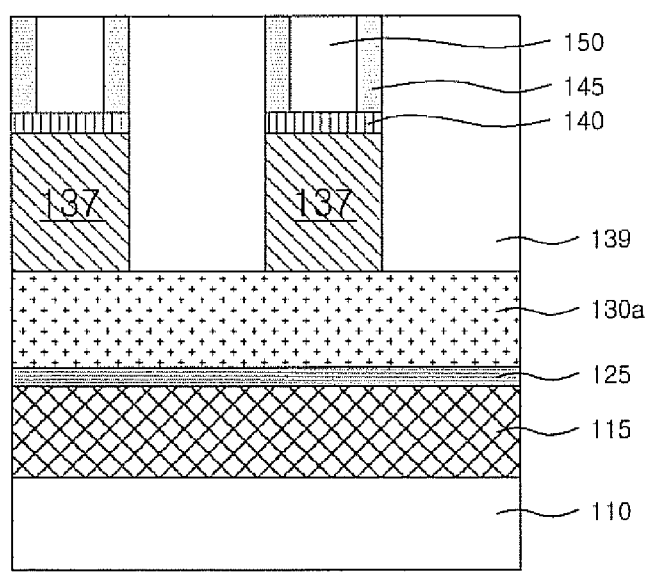
Figure 11:
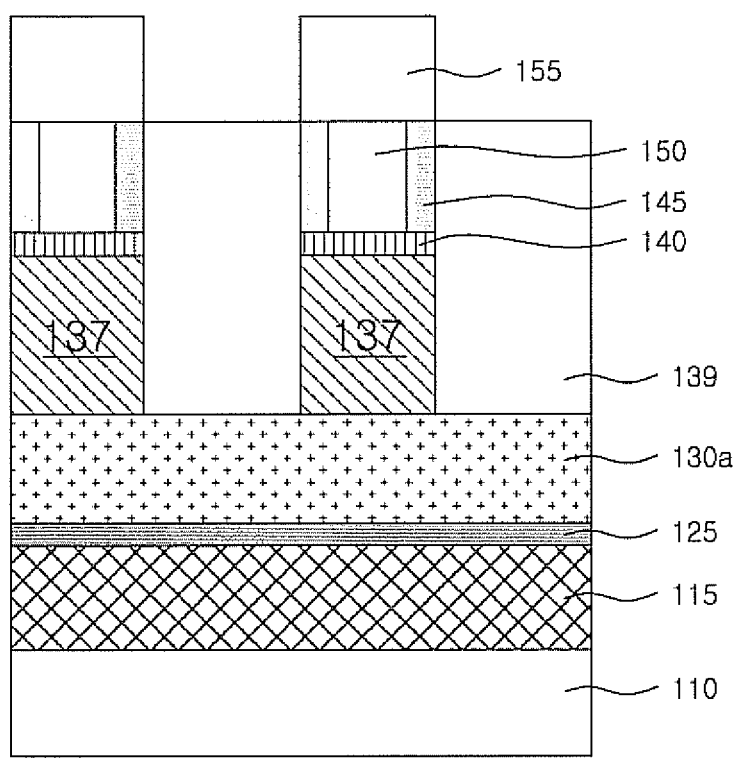

FIGS. 3 to 11 are cross-sectional views for processes illustrating a method of fabricating a semiconductor memory device according to an embodiment. FIGS. 3 to 8 are cross-sectional views of the semiconductor memory device taken along a line A-A' in FIG. 2. FIGS. 9 to 11 are cross-sectional views of the semiconductor memory device taken along a line B-B' in FIG. 2.

Figure 3:
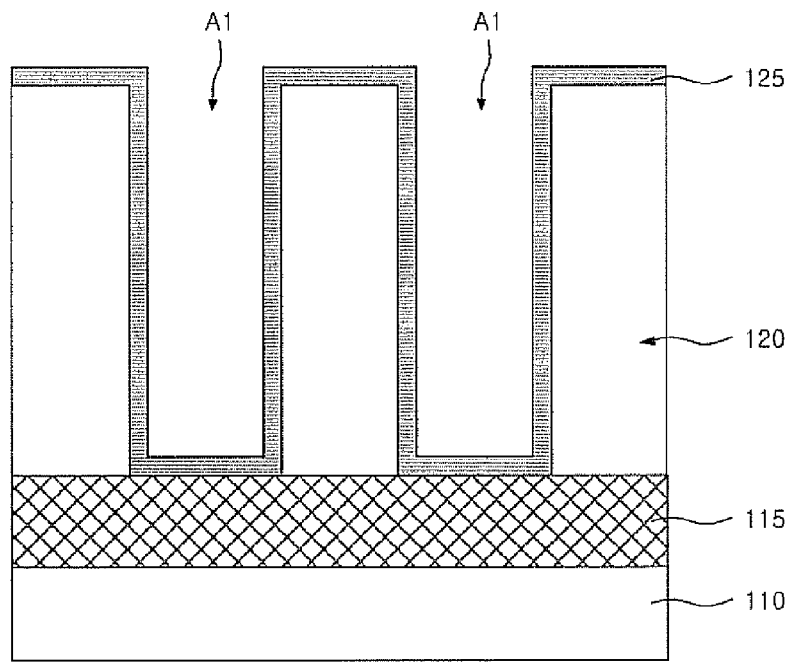
FIGS. 3 to 8 are cross-sectional views illustrating a method of fabricating a PCRAM device taken along a line of A-A' shown in FIG, 2.

Referring to FIG. 3, a base insulating layer 115 is formed on a semiconductor substrate 110. A first interlayer insulating layer 120 is formed on the base insulating layer 115. Then, a portion of the first interlayer insulating layer 120 is etched to form first word line regions A1. The first word line regions A1 may be, for example, regions where even-numbered word lines WL2 and WL4, or odd-numbered word lines WL1 and WL3, are to be formed. An interline insulating layer 125 is covered along surfaces of the first interlayer insulating layer 120, including the first word line regions A1, and the base insulating layer 115. The interline insulating layer 125 may be formed to a minimum thickness to serve as a function of an insulating layer. Further, the interline insulating layer 125 may include a material having a different etch selectivity against the first interlayer insulating layer 120. For example, in the embodiment, the first interlayer insulating layer 120 may be formed of a silicon oxide layer. The interline insulating layer 125 may be formed of a silicon nitride layer.

Figure 4:
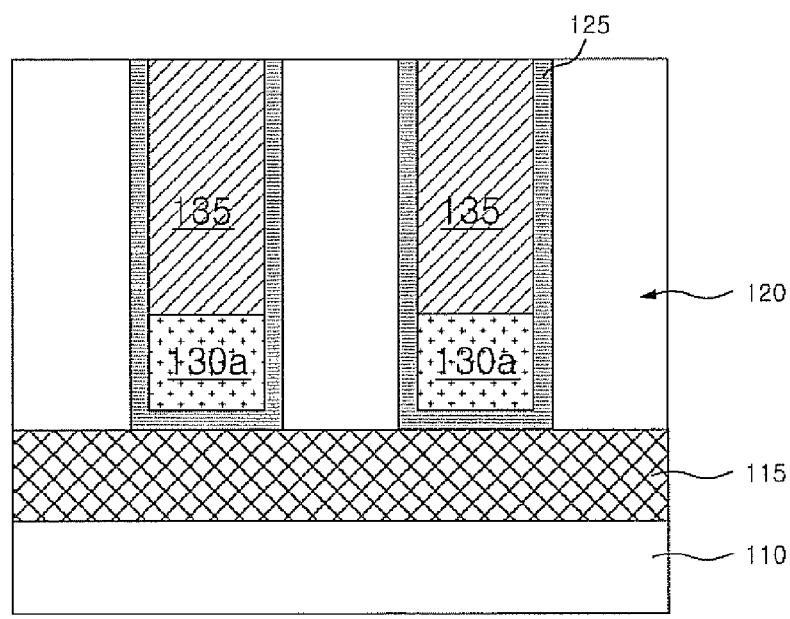

Referring to FIG. 4, a conductive layer is formed on a lower portion of the first word line region A1 to form a first word line 130a. In the embodiment, the first word line 130a may be referred to as the even-numbered word lines WL2 and WL4 in FIG. 2 or the odd-numbered word lines WL1 and WL3 in FIG. 2. The first word line 130a may be formed by depositing the conductive layer and overetching back the conductive layer so that the first word line 130a may be arranged on the lower portion of the first word line region A1. A diode material layer 135 as a switching element is formed on the first word line 130a within the first word line 2F. The diode material layer 135 may include a semiconductor material layer, e.g., a polysilicon layer. The diode material layer 135 may be formed by depositing the semiconductor material layer to be sufficiently filled within the first word line region A1 and planarizing the semiconductor material layer and the interline insulating layer 125 to expose the first interlayer insulating layer 120.

Figure 5:
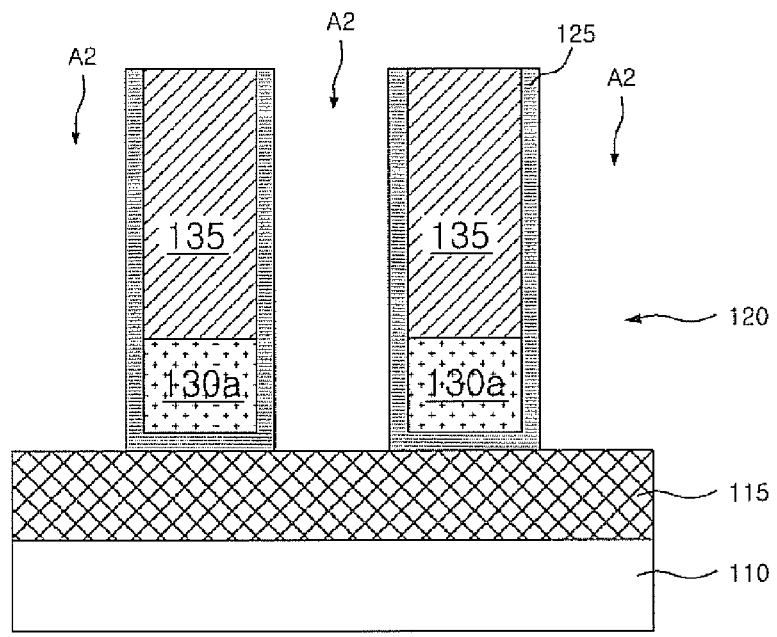

Referring to FIG. 5, the first interlayer insulating layer 120 is selectively removed to form a second word line region A2. The second word line region A2 may be region where the odd-numbered word lines WL1 and WL3 or the even-numbered word lines WL2 and WL4 are to be formed.

Figure 6:
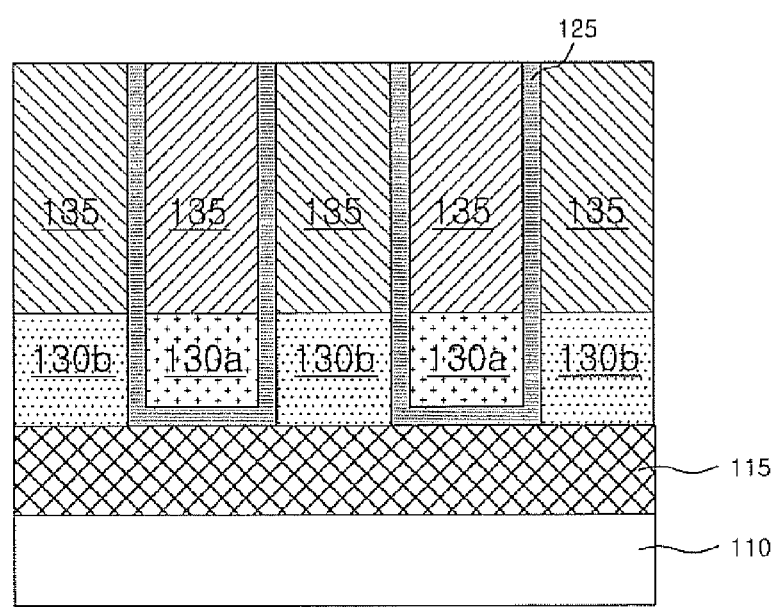

Referring to FIG. 6, a second word line 130b is formed on a lower portion of the second word line region A2. A diode material layer 135 is formed on the second word line 130b within the second word line region A2 as in the first word line region A1. The second word line 130b may be formed of the same material as the first word line 130a using the same formation method as the first word line 130a. The diode material layer 135 on the second word line 130b may be also formed of the same material layer by using the same formation method as the diode material layer 135 formed in the first word line region A1. Herein, the diode material layer 135 on the second word line 130b may have a line shape parallel to the first word line 130a as shown in FIG. 9.

Referring to FIGS. 7 and 10, the diode material layer 135 extending in a line shape is patterned in a pattern shape. A second interlayer insulating layer 139 is formed to insulate the diode material layers having the pattern shape from each other. The diode material layer 135 is recessed by a predetermined depth to define a variable resistive space in the first and second word lines A1 and A2. Subsequently, a predetermined treatment may be performed on the diode material layer 135 to form a diode 137. The predetermined treatment may include an impurity ion implantation process.

A heating electrode 140 is formed on an upper surface of the diode 137. An insulating spacer 145 is formed on a sidewall of a phase-change space, i.e., the variable resistive space, through a conventional method. The insulating spacer 145 may prevent thermal transfer between phase-change materials, i.e., variable resistive materials. A variable resistive material layer 150 is buried within the phase-change space surrounded by the insulating spacer 145. The variable resistive material layer 150 may include any one selected from the group consisting of a phase-change memory layer, a resistive memory layer, a magnetic layer, a magnetization switching layer, and a polymer layer.

Referring to FIGS. 8 and 10, a bit line 155 is formed on the variable resistive material layer 150 in a direction crossing the word lines 130a and 130b through a conventional method.

As described above, the word lines are arranged in line and space regions, respectively, to be insulated by a thin insulating layer. Therefore, the number of word lines and the number of memory cell areas can increase twice so that the high density semiconductor memory device can be fabricated.

Figure 12:
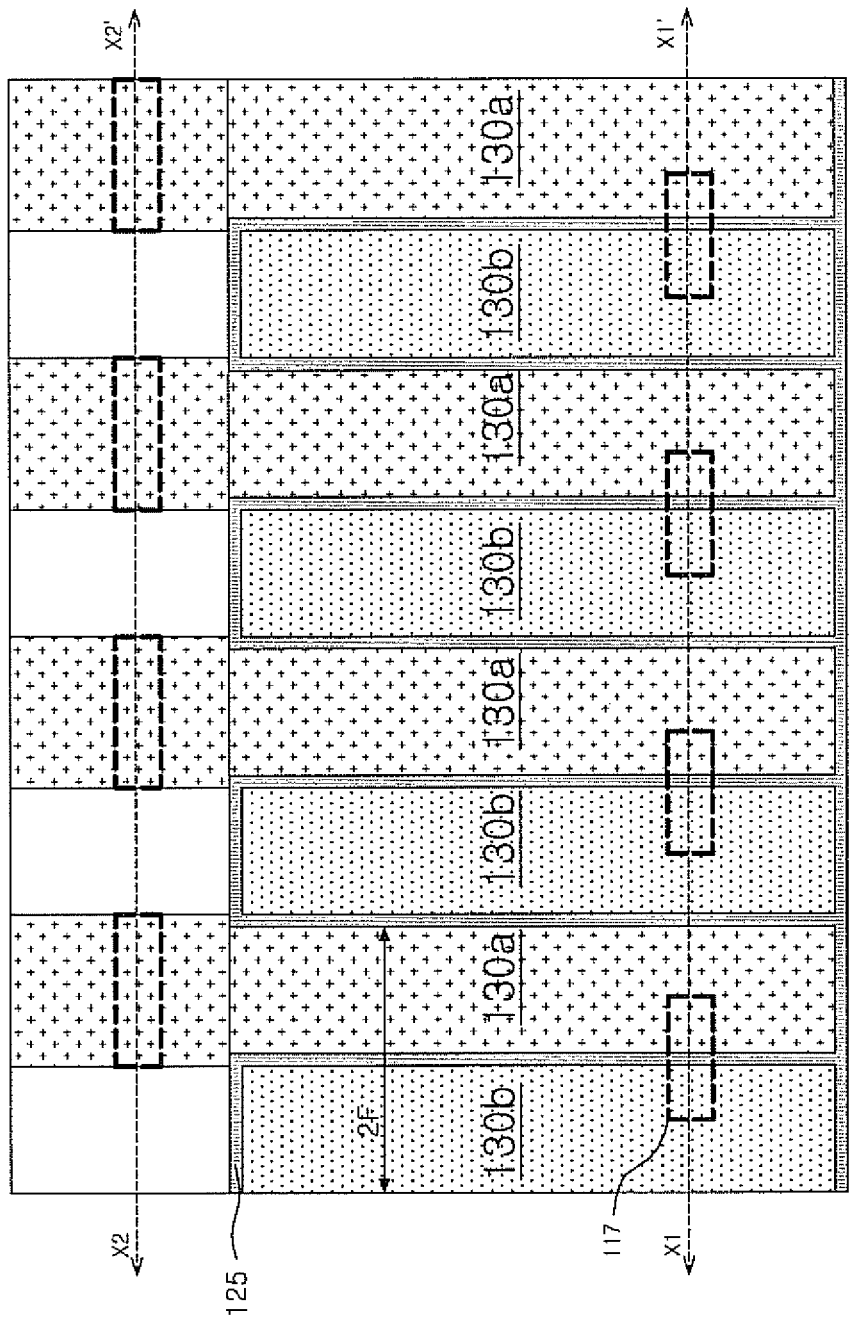
FIG. 12 is a layout diagram illustrating arrangement of a word line according to another embodiment of the inventive concept.
Figure 13:
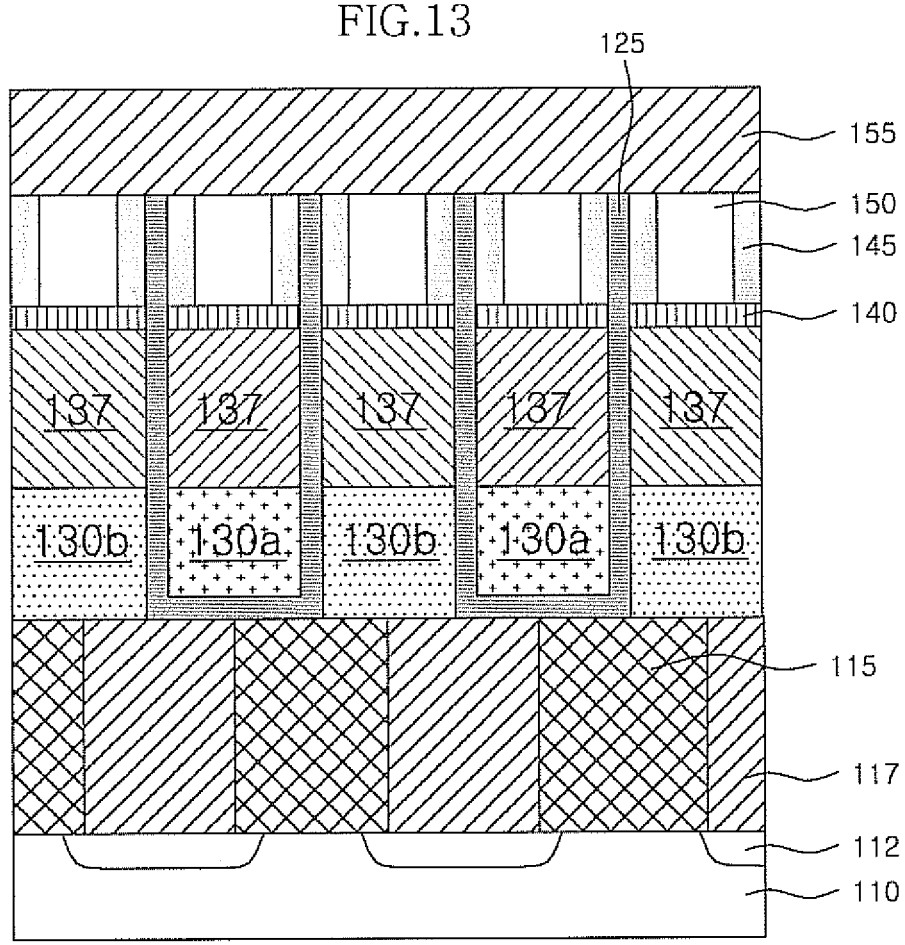
FIG. 13 is a cross-sectional view taken along a line of X1-X1' show in FIG. 12.
Figure 14:
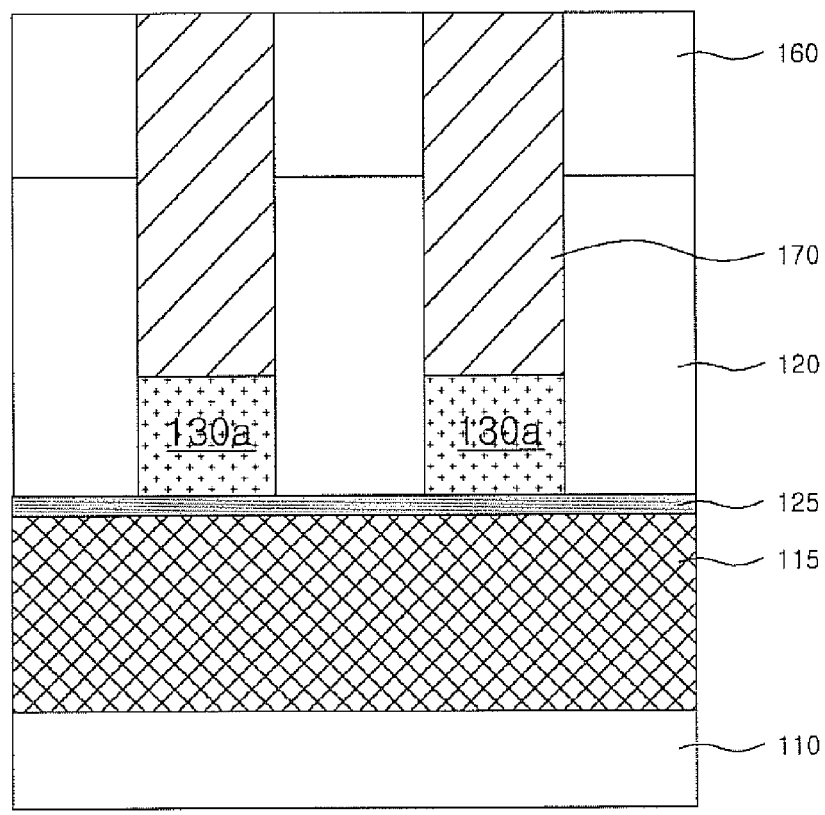
FIG. 14 is a cross-sectional view taken along a line of X2-X2' shown in FIG. 12.

FIGS. 12 to 14 are views illustrating a semiconductor memory device according to another embodiment. FIG. 12 is a layout diagram illustrating an arrangement of a word line according to the embodiment. FIG. 13 is a cross-sectional view taken along a line X1-X1' in FIG. 12. FIG. 14 is a cross-section view taken along a line X2-X2' in FIG. 12.

Referring to FIG. 12, a first word line 130a and a second word line 130b insulated by an interline insulating layer 125 extend parallel to each other without a substantial space. At this time, the first word line 130a may extend by a predetermined length more than the second word line 130b toward a side of a peripheral circuit area Peri. The second word line 130b may be surrounded by the interline insulating layer 125.

Further, the first and second word lines 130a and 130b may receive a word line voltage from the outside. In the related art, word lines are generally connected to junction regions (not shown) formed in the semiconductor substrate 110 and an external power terminal through a lower contact unit located in a base insulating layer 115.

However, in the embodiment, since the word lines 130a and 130b are also formed in the space region, the word lines 130a and 130b cannot be connected to all the junction regions.

In the embodiment, as shown in FIG. 13, junction regions 112 may be formed on the semiconductor substrate 110 corresponding to line regions of a first direction at a first pitch interval as in the related art. The second word line 130b surrounded by the interline insulating layer 125 may be selectively connected to the junction region 112 through a first contact unit 117 formed in the base insulating layer 115.

It is not necessary for the first contact unit 117 to be accurately aligned to be in contact with the second word line 130b. Since the first word line 130a adjacent to the second word line 130b is surrounded by the interline insulating layer 125, an electrical problem does not occur when the first contact unit 117 is arranged between the first and second word lines 130a and 130b as shown in FIG. 13.

As shown in FIG. 14, a second contact unit 170 may be arranged to connect to an external power terminal in a portion of the first word line 130a extending toward the peripheral circuit area Peri. The second contact unit 170 may be arranged on the first word line 130a.

Therefore, even when the first and second word lines 130a and 130b are arranged without substantial spacers, the first and second word lines are easily connected to the external power terminal.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A variable resistive memory device, comprising:
a semiconductor substrate in which line regions and space regions substantially having the same line widths are alternatively defined in a first direction and a second direction perpendicular to the first direction and junction regions are formed portions thereof corresponding to line regions of the first direction;
first word lines formed on the semiconductor substrate and arranged in space regions of the first direction with the substantially same line widths;
second word lines formed on the semiconductor substrate and arranged in the line regions of the first direction with the substantially same line widths;
an interline insulating layer formed to surround sides and bottoms of the first word lines;
a plurality of bit lines formed on the first and second word lines and arranged in line regions of the second direction to cross the first and second word lines; and
a plurality of memory cells formed at intersections of the pluralities of first and second word lines and the plurality of bit lines.

2. The variable resistive memory device of claim 1, further comprising:
upper contact units arranged on the first word lines and configured to electrically connect the first word lines to an external power terminal; and
lower contact units arranged below the second word lines and configured to electrically connect the second word lines and the junction regions.

3. The variable resistive memory device of claim 2, the first word lines include extension units extending toward a peripheral circuit area more than the second word lines, and
the upper contact units are arranged on the extension units of the first word lines.

4. A method of fabricating a variable resistive memory device, the method comprising
providing a semiconductor substrate in which line regions and space regions substantially having the same line widths are alternatively defined in a first direction and a second direction perpendicular to the first direction;
forming a base insulating layer on the semiconductor substrate;
stacking an interlayer insulating layer on the base insulating layer;
etching the interlayer insulating layer corresponding to space regions of the first direction to define first word line regions;
forming an interline insulating layer on bottoms and sidewalls of the first word lines;
forming first word lines with the substantially same line widths and switching elements connected to the first word lines in the first word line regions;
selectively removing the remaining interlayer insulating layer to define second word line regions;
forming second word lines with the substantially same line widths and switching elements connected to the second word lines in the second word line regions; and
forming variable resistive memory cells formed on the switching elements of the first and second word line regions.

5. The method of claim 4, wherein the forming an interline insulating layer includes:
covering the interline insulating layer along surfaces of the first word line regions and an upper surface of the interlayer insulating layer; and
planarizing the interline insulating layer so that the interline insulating layer remains on the surfaces the first word lines.

6. The method of claim 4, wherein the forming first word lines and switching elements in contact with the first word lines includes:
forming the first word lines on lower portions of the first word line regions; and
burying the switching elements formed of a semiconductor layer on the first word lines in the first word line regions.

7. The method of claim 4, wherein the forming variable resistive memory cells includes:
defining variable resistive spaces by recessing the switching elements by a predetermined thickness;

forming insulating spacers on sidewalls of the variable resistive spaces; and burying resistive material layers in the variable resistive spaces surrounded by the insulating spacers.

8. The method of claim 4, further comprising:

forming a plurality of bit lines on the variable resistive memory cells; and connecting the second word lines to an external power terminal after the forming a plurality of bit lines.

9. The method of claim 4, further comprising forming contact units configured to electrically connect the first word lines to junction regions in the base insulating layer between the forming a base insulating layer and the forming an interlayer insulating layer.

\* \* \* \* \*